(12) United States Patent
Morales et al.

(10) Patent No.: US 9,824,166 B2
(45) Date of Patent: Nov. 21, 2017

(54) METHODS, SYSTEMS, AND COMPUTER READABLE MEDIA FOR UTILIZING PARALLEL ADAPTIVE RECTANGULAR DECOMPOSITION (ARD) TO PERFORM ACOUSTIC SIMULATIONS

(71) Applicant: The University of North Carolina at Chapel Hill, Chapel Hill, NC (US)

(72) Inventors: Nicolas Manuel Morales, Carrboro, NC (US); Ravish Mehra, Chapel Hill, NC (US); Dinesh Manocha, Chapel Hill, NC (US)

(73) Assignee: THE UNIVERSITY OF NORTH CAROLINA AT CHAPEL HILL, Chapel Hill, NC (US)

( * ) Notice: Subject to any disclaimer, the term of this patent is extended or adjusted under 35 U.S.C. 154(b) by 343 days.

(21) Appl. No.: 14/743,598

(22) Filed: Jun. 18, 2015

(65) Prior Publication Data

US 2016/0171131 A1 Jun. 16, 2016

Related U.S. Application Data

(60) Provisional application No. 62/014,095, filed on Jun. 18, 2014.

(51) Int. Cl.
*G06F 17/50* (2006.01)
*G10L 19/00* (2013.01)

(52) U.S. Cl.
CPC ......... *G06F 17/5009* (2013.01); *G10L 19/00* (2013.01); *H04S 2420/11* (2013.01)

(58) Field of Classification Search
USPC ............... 703/2, 6, 18; 381/161; 463/35
See application file for complete search history.

(56) References Cited

U.S. PATENT DOCUMENTS 9,398,393 B2 * 7/2016 Antani ............... H04S 7/305
9,510,125 B2 * 11/2016 Raghuvanshi .......... H04S 7/30
(Continued)

OTHER PUBLICATIONS

Saarelma et al., "An open source finite-difference time domain solver for room acoustics using graphics processing units," Forum Acusticum 2014, Krakow (Sep. 7-12, 2014).
(Continued)

*Primary Examiner* — Thai Phan
(74) *Attorney, Agent, or Firm* — Jenkins, Wilson, Taylor & Hunt, P.A.

(57) ABSTRACT

Methods, systems, and computer readable media for utilizing parallel adaptive rectangular decomposition (ARD) to perform acoustic simulations are disclosed herein. According to one method, the method includes assigning, to each of a plurality of processors in a central processing unit (CPU) cluster, ARD processing responsibilities associated with one or more of a plurality of partitions of an acoustic space and determining, by each processor, pressure field data corresponding to the one or more assigned partitions. The method further includes transferring, by each processor, the pressure field data to at least one remote processor that is assigned to a partition that shares an interface with at least one partition assigned to the transferring processor and receiving, by each processor from the at least one remote processor, forcing term values that have been derived by the at least one remote processor using the pressure field data.

45 Claims, 5 Drawing Sheets

(56) References Cited

U.S. PATENT DOCUMENTS

| | | | | |
|---|---|---|---|---|
| 2014/0161268 | A1* | 6/2014 | Antani | H04S 7/305 |
| | | | | 381/63 |
| 2015/0057083 | A1* | 2/2015 | Mehra | G10K 11/04 |
| | | | | 463/35 |
| 2015/0294041 | A1* | 10/2015 | Yeh | G06F 17/5009 |
| | | | | 703/2 |

OTHER PUBLICATIONS

Sheaffer et al., "WaveCloud: an open source room acoustics simulator using the finite difference time domain method," Forum Acusticum 2014, Krakow (Sep. 7-12, 2014).
Schissler et al., "High-order diffraction and diffuse reflections for interactive sound propagation in large environments," ACM Transactions on Graphics (SIGGRAPH 2014), vol. 33, No. 4, pp. 39:1-39:12 (Jul. 2014).
Mehra et al., "Source and listener directivity for interactive wave-based sound propagation," IEEE Transactions on Visualization and Computer Graphics, vol. 20, No. 4 pp. 495-503 (Apr. 2014).
Yeh et al., "Wave-ray coupling for interactive sound propagation in large complex scenes," ACM Trans. Graph., vol. 32, No. 6, Article 165, pp. 1-11 (Nov. 2013).
Bilbao, "Modeling of Complex Geometries and Boundary Conditions in Finite Difference/Finite Volume Time Domain Room Acoustics Simulation," IEEE Transactions on Audio, Speech, and Language Processing, pp. 1-10 (Jul. 2013).
Webb et al., "Binaural Simulations Using Audio Rate FDTD Schemes and CUDA," Proceedings of the 15th International Conference on Digital Audio Effects, York, UK, pp. 1-4 (Sep. 17-21, 2012).
Mehra et al., "An efficient GPU-based time domain solver for the acoustic wave equation," The Journal of the Acoustical Society of America (Apr. 2012).
Wang et al., "Massively parallel structured multifrontal solver for time-harmonic elastic waves in 3D anisotropic media," Proceedings of the Project Review, Geo-Mathematical Imaging Group (Purdue University, West Lafayette, IN), vol. 1, pp. 97-121 (2012).
Kowalcsyk et al., "Room acoustics simulation using 3-D compact explicit FDTD schemes," IEEE Transactions on Audio, Speech, and Language Processing, vol. 19, No. 1, pp. 34-46 (Jan. 2011).
Alghamdi et al., "PetClaw: A Scalable Parallel Nonlinear Wave Propagation Solver for Python," Proceedings of the 19th High Performance Computing Symposia, Society for Computer Simulation International, pp. 96-103 (2011).
Catalyürek et al., "PaToH: Partitioning Tool for Hypergraphs," Encyclopedia of Parallel Computing, pp. 1-31 (2011).
Vaccari et al., "Parallel implementation of a 3D subgridding FDTD algorithm for large simulations," Progress in Electromagnetic Research, vol. 120, pp. 263-292 (2011).
Savioja, "Real-time 3D finite-difference time-domain simulation of low- and mid-frequency room acoustics," Proceedings of the 13th International Conference on Digital Audio Effects (DAFx-10), Graz, Austria, pp. 1-8 (Sep. 6-10, 2010).
Chen et al., "Analysis of mutiple-shepers radiation and scatterign problems by using a null-field integral equation approach," Applied Acoustics, vol. 71, No. 8, pp. 690-700 (2010).
Yu et al., "A new direction in computational electromagnetics: Solving large problems using the parallel FDTD on BlueGene/L supercomputer providing Teraflop-Level performance," IEEE Antennas and Propagation Magazine, vol. 50, No. 2, pp. 26-44 (Apr. 2008).
Operto et al., "3D finite-difference frequency-domain modeling of visco-acoustic wave propagation using a massively parallel direct solver: a feasibility study," pp. 1-61 (May 23, 2007).
Bernacki et al., "Parallel discontinuous Galerkin unstructured mesh solvers for the calculation of three-dimensional wave propagation problems," Applied Mathematical Modelling, vol. 30, No. 8, pp. 744-763 (2006).

Thompson, "A review of finite-element methods for time-harmonic acoustics," The Journal of the Acoustical Society of America, vol. 119, No. 3, pp. 1315-1330 (2006).
Yu et al., "A robust parallel conformal finite-difference time-domain processing package using the MPI Library," IEEE Antennas and Propagation Magazine, vol. 47, No. 3, pp. 39-59 (Jun. 2005).
Engquist et al., "Computational high frequency wave propagation," Acta Numerica, pp. 181-266 (Apr. 2003).
Rickard et al., "Application and optimization of PML ABC for the 3-D wave equation in the time domain," IEEE Transactions on Antennas and Propagation, vol. 51, No. 2, pp. 286-295 (Feb. 2003).
Funkhouser et al., "Survey of methods for modeling sound propagation in interactive virtual environment systems," Presence and Teleoperation, pp. 1-53 (2003).
Schwan, "Lustre: Building a file system for 1000-node clusters," Proceedings of the 2003 Linux Symposium, vol. 2003, pp. 380-386 (2003).
Guiffaut et al., "A parallel FDTD algorithm using the MPI library," IEEE Antennas and Propagation Magazine, vol. 43, No. 2, pp. 94-103 (Apr. 2001).
Savioja et al., "Reducing the dispersion error in the digital waveguide mesh using interpolation and frequency-warping techniques," IEEE Transactions on Speech and Audio Processing, vol. 8, No. 2, pp. 184-194 (Mar. 2000).
Bhandarkar et al., "A Parallel Framework for Explicit FEM," Department of Computer Science, University of Illinois at Urbana—Champaign, pp. 1-18 (2000).
Bao et al., "Large-scale simulation of elastic wave propagation in heterogeneous media on parallel computers," Computer Methods in Applied Mechanics and Engineering, vol. 152, No. 1, pp. 85-102 (1998).
Funkhouser et al., "A beam tracing approach to acoustic modeling for interactive virtual environments," Proceedings of ACM SIGGRAPH, pp. 21-32 (1998).
Huang et al., "An accurate method for voxelizing polygon meshes," IEEE Symposium on Volume Visualization, pp. 119-126 (1998).
Keil, "Polygon Decomposition," Department of Computer Science, University of Saskatchewan, Saskatoon, Sask., Canada, pp. 1-42 (May 14, 1996).
Diekmann et al., "PadFEM: A Portable Parallel FEM-Tool," High-Performance Computing and Networking Springer, pp. 580-585 (1996).
Savioja et al., "Waveguide mesh method for low-frequency simulation of room acoustics," pp. 1-5 (1995).
Chan et al., "Domain decomposition algorithms," Acta Numerica, pp. 61-143 (1994).
Van Duyne et al., "The 2-D digital waveguide mesh," 1993 IEEE Workshop on Applications of Signal Processing to Audio and Acoustics, Final Program and Paper Summaries, pp. 177-180 (1993).
Dielissen et al., "Rectangular partition is polynomial in two dimensions but NP-complete in three," Information Processing Leters, vol. 38, No. 1, pp. 1-6 (1991).
Saied et al., "Multigrid methods for computational acoustics on vector and parallel computers," Urbana, 51:61801, pp. 1-11 (1991).
Allen et al., "Image method for efficiently simulating small-room acoustics," The Journal of the Acoustical Society of America, vol. 65, No. 4, pp. 943-950 (Apr. 1979).
Morales et al., "MPARD: A scalable time-domain acoustic wave solver for large distributed clusters," Technical report, Department of Computer Science, University of North Carolina at Chapel Hill, Chapel Hill, North Carolina, pp. 1-16 (2015).
Kuttruff, "Room Acoustics," Fifth Edition, Span Press, pp. 1-374 (2009).
Raghuvanshi et al., "Efficient and accurate sound propagation using adaptive rectangular decomposition," IEEE Transactions on Visualization and Computer Graphics, vol. 15, No. 5, pp. 1-10 (2009).
Sypek et al., "How to render FDTD computations more effective using a graphics accelerator," IEEE Transactions on Magnetics, vol. 45, No. 3, pp. 1324-1327 (2009).

(56) References Cited

OTHER PUBLICATIONS

Sakamoto et al., Abstract "Numerical analysis of sound propagation in rooms using the finite difference time domain method," The Journal of the Acoustics Society of America, vol. 120, No. 5, p. 3008 (2006).

Crocker, "Handbook of Acoustics," Chapter 26, Sonochemistry and Sonoluminescence, Wiley & Sons, pp. 1-24 (20 pgs) (1998).

\* cited by examiner

METHODS, SYSTEMS, AND COMPUTER READABLE MEDIA FOR UTILIZING PARALLEL ADAPTIVE RECTANGULAR DECOMPOSITION (ARD) TO PERFORM ACOUSTIC SIMULATIONS

PRIORITY CLAIM

This application claims the benefit of U.S. Provisional Patent Application Ser. No. 62/014,095, filed Jun. 18, 2014; the disclosure of which is incorporated herein by reference in its entirety.

GOVERNMENT INTEREST

This invention was made with government support under Grant Nos. W911NF-10-1-0506, W911NF-12-1-0430, and W911NF-13-C-0037 awarded by the Army Research Office and Grant Nos. 1320644 and 1345913 awarded by the National Science Foundation. The government has certain rights in the invention.

TECHNICAL FIELD

The subject matter described herein relates to sound propagation. More specifically, the subject matter relates to methods, systems, and computer readable media for utilizing parallel adaptive rectangular decomposition to perform acoustic simulations.

BACKGROUND

The computational modeling and simulation of acoustic spaces is fundamental to many scientific and engineering applications [10]. The demands vary widely, from interactive simulation in computer games and virtual reality to highly accurate computations for offline applications, such as architectural design and engineering. Acoustic spaces may correspond to indoor spaces with complex geometric representations (such as multi-room environments, automobiles, or aircraft cabins), or to outdoor spaces corresponding to urban areas and open landscapes.

Computational acoustics has been an area of active research for almost half a century and is related to other fields (such as seismology, geophysics, meteorology, etc.) that deal with similar wave propagation through different mediums. Small variations in air pressure (the source of sound) are governed by the three-dimensional wave equation, a second-order linear partial differential equation. The computational complexity of solving this wave equation increases as at least the cube of frequency, and is a linear function of the volume of the scene. Given the auditory range of humans (20 Hz-20 kHz), performing wave-based acoustic simulation for acoustic spaces corresponding to a large environment, such as concert hall or a cathedral (e.g. volume of 10,000-15,000 m$^3$) for the maximum simulation frequency of 20 kHz requires tens of Exaflops of computational power and tens of terabytes of memory. In fact, wave-based numeric simulation of the high frequency wave equation is considered one of the more challenging problems in scientific computation[13].

Current acoustic solvers are based on either geometric or wave-based techniques. Geometric methods, which are based on image source methods or ray-tracing and its variants [2, 14, 28], do not accurately model certain low-frequency features of acoustic propagation, including diffraction and interference effects. The wave-based techniques, on the other hand, directly solve governing differential or integral equations which inherently account for wave behavior. Some of the widely-used techniques are the finite-difference time domain method (FDTD) [25, 6], finite-element method (FEM) [31], equivalent source method (ESM) [18], or boundary-element method (BEM) [9, 8]. However, these solvers are mostly limited to low-frequency (less than 2 kHz) acoustic wave propagation for larger architectural or outdoor scenes, as higher-frequency simulation on these kinds of scenes requires extremely high computational power and terabytes of memory. Hybrid techniques also exist which take advantage of the strengths of both geometric and wave-based propagation[35].

Recently developed low-dispersion wave methods for solving the wave equation reduce the computational overhead and memory requirements [17], [26]. One of these methods is the adaptive rectangular decomposition (ARD) technique [22, 19], which performs three-dimensional acoustic wave propagation for homogeneous media (implying a spatially-invariant speed of sound). ARD is a domain decomposition technique that partitions a scene in rectangular (cuboidal in 3D) regions, computes local pressure fields in each partition, and combines them to compute the global pressure field using appropriate interface operators. Previously, ARD has been used to perform acoustic simulations on small indoor and outdoor scenes for a maximum frequency of 1 kHz using only a few gigabytes of memory on a high-end desktop machine. However, performing accurate acoustic simulation for large acoustic spaces up to the full auditory range of human hearing still requires terabytes of memory (e.g., which may be provided by one or more special purpose computer machines). Therefore, there is a need to develop efficient parallel algorithms, scalable on distributed memory clusters, to perform these large-scale acoustic simulations.

Accordingly, there exists a need for systems, methods, and computer readable media for utilizing parallel adaptive rectangular decomposition to perform acoustic simulations.

SUMMARY

Methods, systems, and computer readable media for utilizing parallel adaptive rectangular decomposition (ARD) to perform acoustic simulations are disclosed herein. According to one method, the method includes assigning, to each of a plurality of processors in a central processing unit (CPU) cluster, ARD processing responsibilities associated with one or more of a plurality of partitions of an acoustic space and determining, by each of a plurality of processors, pressure field data corresponding to the one or more assigned partitions. The method further includes transferring, by each processor, the pressure field data to at least one remote processor that is assigned to a partition that shares an interface with at least one partition assigned to the transferring processor and receiving, by each processor from the at least one remote processor, forcing term values that have been derived by the at least one remote processor using the pressure field data. The method also includes utilizing, by each processor, the received forcing term values to calculate at least one local partition pressure field that is used to update a global pressure field associated with the acoustic space.

A system for utilizing parallel ARD to perform acoustic simulations is also disclosed. The system includes a preprocessing module and a parallel ARD simulation module, both of which are executable by a processor. In some embodiments, the preprocessing module is configured to assign, to each of a plurality of processors in a central processing unit (CPU) cluster, ARD processing responsibilities associated with one or more of a plurality of partitions of an acoustic space. Likewise, the parallel ARD simulation module is configured to determine, by each of a plurality of processors, pressure field data corresponding to the one or more assigned partitions and transfer, by each processor, the pressure field data to at least one remote processor that is assigned to a partition that shares an interface with at least one partition assigned to the transferring processor. The parallel ARD simulation module is also configured to receive, by each processor from the at least one remote processor, forcing term values that have been derived by the at least one remote processor using the pressure field data and utilize, by each processor, the received forcing term values to calculate at least one local partition pressure field that is used to update a global pressure field associated with the acoustic space.

The subject matter described herein can be implemented in software in combination with hardware and/or firmware. For example, the subject matter described herein can be implemented in software executed by one or more processors. In one exemplary implementation, the subject matter described herein may be implemented using a non-transitory computer readable medium having stored thereon computer executable instructions that when executed by the processor of a computer control the computer to perform steps. Exemplary computer readable media suitable for implementing the subject matter described herein include non-transitory devices, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

As used herein, the terms "node" and "host" refer to a physical computing platform or device including one or more processors and memory.

As used herein, the terms "function" and "module" refer to software in combination with hardware and/or firmware for implementing features described herein.

BRIEF DESCRIPTION OF THE DRAWINGS

Preferred embodiments of the subject matter described herein will now be explained with reference to the accompanying drawings, wherein like reference numerals represent like parts, of which.

DETAILED DESCRIPTION

The subject matter described herein discloses methods, systems, and computer readable media for utilizing parallel adaptive rectangular decomposition (ARD) to perform acoustic simulations. For example, a parallel time-domain simulator to solve the acoustic wave equation for large acoustic spaces on a distributed memory architecture is described. Notably, the formulation is based on an ARD algorithm, which performs acoustic wave propagation in three dimensions for homogeneous media. An efficient parallelization of the different stages of the ARD pipeline is proposed. By using a novel load balancing scheme and overlapping communication with computation, scalable performance on distributed memory architectures is achieved. For example, the ARD simulator/solver can handle the full frequency range of human hearing (20 Hz-20 kHz) in scenes with volumes of thousands of cubic meters. Accordingly, the present subject matter affords an extremely fast time-domain simulator for acoustic wave propagation in large, complex three dimensional (3D) scenes such as outdoor or architectural environments.

The present subject matter includes a novel, distributed time-domain simulator that performs accurate acoustic simulation in large environments. Notably, embodiments of the present subject matter may be based on an ARD solver machine and is designed for CPU clusters. Two primary components of the disclosed approach include an efficient load-balanced domain decomposition algorithm and an asynchronous technique for overlapping communication with computation for ARD.

In some embodiments, a parallel simulator is used to perform acoustic propagation in large, complex indoor and outdoor environments for high frequencies. Near-linear scalability is gained with a load-balancing scheme and an asynchronous communication technique. As a result, when the scale of the computational domain increases, either through increased simulation frequency or higher volume, more computational resources can be added and more efficiently used. This efficiency is compounded by the low-dispersion nature of the underlying ARD solving algorithm.

For example, one implementation shows scalability up to 1024 cores of a CPU cluster with 4 terabytes of memory. Using these resources, sound fields on large architectural and outdoor scenes up to 4 kHz can be efficiently computed. As such, at least some embodiments of the parallel ARD solver affords a practical parallel wave-simulator that can perform accurate acoustic simulation on large architectural or outdoor scenes for this range of frequencies.

Reference will now be made in detail to exemplary embodiments of the subject matter described herein, examples of which are illustrated in the accompanying drawings. Wherever possible, the same reference numbers will be used throughout the drawings to refer to the same or like parts.

Figure 1:
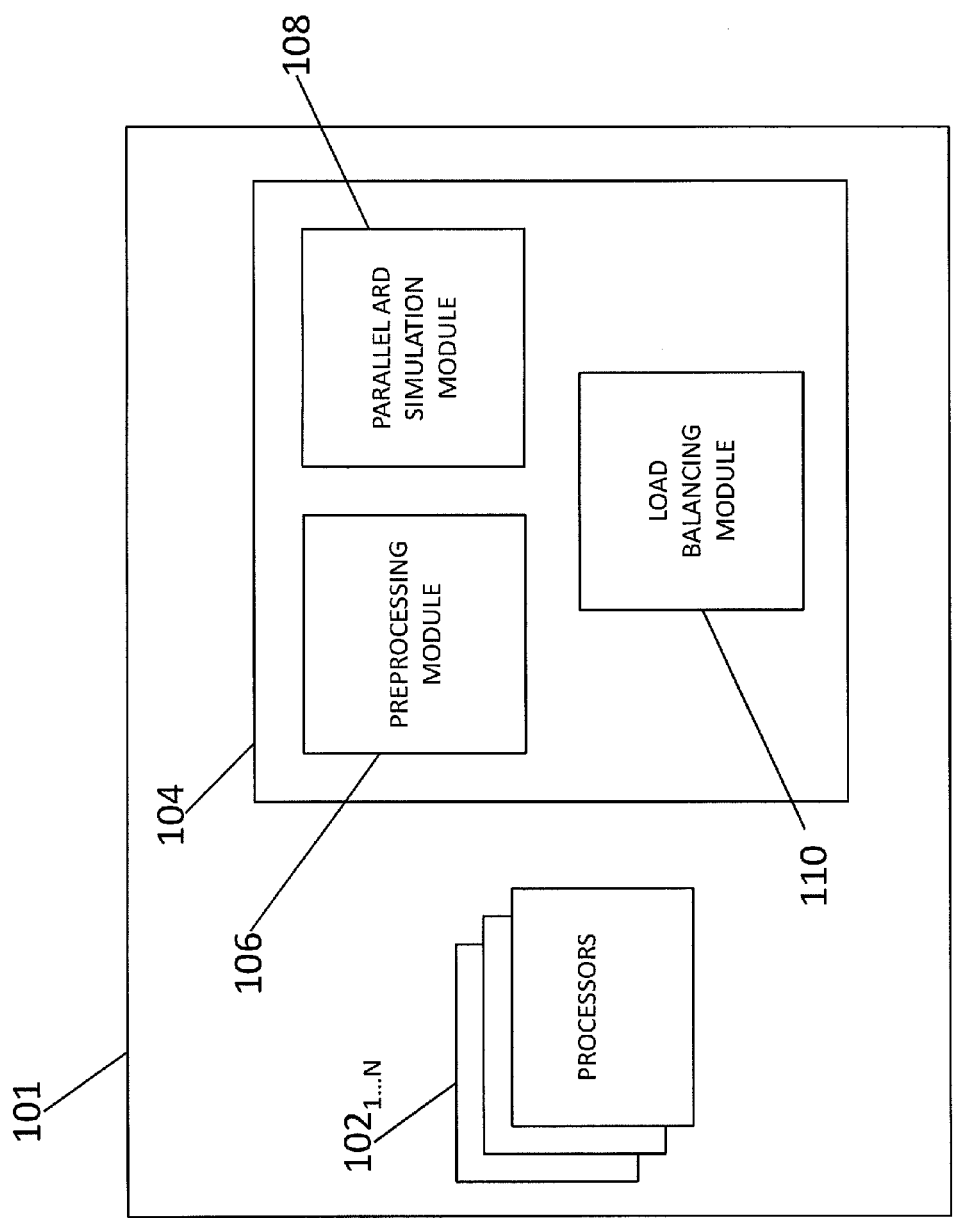
FIG. 1 is a diagram illustrating an exemplary node for utilizing parallel adaptive rectangular decomposition to perform acoustic simulations according to an embodiment of the subject matter described herein.

FIG. 1 is a block diagram illustrating an exemplary node 101 (e.g., a multiple processor core computing device) for simulating sound propagation according to an embodiment of the subject matter described herein. Node 101 may be any suitable entity, such as a computing device or platform, for performing one more aspects of the present subject matter described herein. In accordance with embodiments of the subject matter described herein, components, modules, and/ or portions of node 101 may be implemented or distributed across multiple devices or computing platforms. For example, a cluster of nodes 101 may be used to perform various portions of a sound propagation technique or application. In some embodiments, node 101 comprises a special purpose computer functioning as a parallel time-acoustic wave solver machine and is configured to compute sound pressure fields for various frequencies in a large environment (e.g., thousands of cubic meters in volume). Notably, the present subject matter improves the technological field of acoustic simulations by providing the technological benefit of efficient parallelization of different stages of an ARD pipeline that may achieve scalable performance on distributed memory architectures.

In some embodiments, node 101 may comprise a computing platform that includes a plurality of processors $102_1 \ldots _N$ that make up a central processing unit (CPU) cluster. In some embodiments, each of processors 102 may include a processor core, a physical processor, a field-programmable gateway array (FPGA), an application-specific integrated circuit (ASIC)), and/or any other like processing unit. Each of processors $102_1 \ldots _N$ may include or access memory 104, such as for storing executable instructions. Node 101 may also include memory 104. Memory 104 may be any non-transitory computer readable medium and may be operative to communicate with processors 102. Memory 104 may include (e.g., store) a preprocessing module 106, a parallel ARD simulation module 108, and load balancing module 110. In accordance with embodiments of the subject matter described herein, preprocessing module 106 may be configured to cause (via a processor) each of processors $102_1 \ldots _N$ to be assigned with ARD processing responsibilities associated with one or more of a plurality of partitions of an acoustic space. In some embodiments, preprocessing module 106 may be configured to perform other functions, such as decomposing the acoustic space into the plurality of partitions (e.g., air partition or a perfectly matched layer partition) and voxelizing the acoustic scene (e.g., acoustic space) into grid cells, wherein the grid cells are subsequently grouped into the plurality of partitions via ARD.

As used herein, ARD is a numerical simulation technique that performs sound propagation by solving the acoustic wave equation in the time domain [22]:

$$\frac{\partial^2}{\partial t^2} p(X, t) - c^2 \nabla^2 p(X, t) = f(X, t), \quad (1)$$

where X=(x,y,z) is the point in the 3D domain, t is time, p(X,t) is the sound pressure (which varies with time and space), c is the speed of sound, and f(X,t) is a forcing term corresponding to the boundary conditions and sound sources in the environment. In this paper, we limit ourselves to homogeneous domains, where c is treated as a constant throughout the media.

The ARD simulation technique belongs to a class of techniques, referred to as domain-decomposition techniques. In this regard, ARD uses a key property of the wave equation: the acoustic wave equation has known analytical solutions for rectangular (cuboidal in 3D) domains for homogeneous media. In some embodiments, the underlying ARD solver (e.g., modules 106 and/or 108 executed by at least one processor 102) exploits this property by decomposing a domain (e.g., an acoustic space to be simulated) in rectangular (cuboidal) partitions, computing local solutions inside the partitions, and then combining the local solutions with interface operators to find the global pressure field over the entire domain.

In some embodiments, a cuboidal domain in three dimensions of size $(l_x, l_y, l_z)$ with perfectly reflecting walls may include an analytical solution that is represented by the acoustic wave equation as:

$$p(x, y, z, t) = \sum_{i=(i_x, i_y, i_z)} m_i(t) \Phi_i(x, y, z), \quad (2)$$

where $m_i$ are the time-varying mode coefficients and $\Phi_i$ are the eigen functions of the Laplacian for the cuboidal domain, given by:

$$\Phi_i(x, y, z) = \cos\left(\frac{\pi i_x}{l_x} x\right) \cos\left(\frac{\pi i_y}{l_y} y\right) \cos\left(\frac{\pi i_z}{l_z} z\right). \quad (3)$$

The modes computed may be limited to the Nyquist rate of the maximum simulation frequency.

In order to compute the pressure, an ARD solver may compute the mode coefficients. Reinterpreting equation (2) in the discrete setting, the discrete pressure P(X,t) corresponds to an inverse Discrete Cosine Transform (iDCT) of the mode coefficients $M_i(t)$:

$$P(X,t) = \text{iDCT}(M_i(t)). \quad (4)$$

Substituting the above equation in equation (1) and applying a DCT operation on both sides, we get $$\frac{\partial^2}{\partial t^2} M_i + c^2 k_i^2 M_i = DCT(F(X, t)), \quad (5)$$

where $$k_i^2 = \pi^2 \left( \frac{i_x^2}{l_x^2} + \frac{i_y^2}{l_y^2} + \frac{i_z^2}{l_z^2} \right)$$

and F(X,t) is the force in the discrete domain. Assuming the forcing term F(X,t) to be constant over a time-step $\Delta t$ of simulation, the following update rule can be derived for the mode coefficients:

$$M_i^{n+1} = 2 M_i^n \cos(\omega_i \Delta t) - M_i^{n-1} + \frac{2\tilde{F}_i^n}{\omega_i^2}(1 - \cos(\omega_i \Delta t)), \quad (6)$$

where $\tilde{F}$ =DCT(F(X,t)). This update rule can be used to generate the mode-coefficients (and thereby pressure) for the next time-step. This provides a method to compute the analytical solution of the wave equation for a cuboidal domain (e.g., via an ARD solver).

In order to ensure correct sound propagation across the boundaries (e.g., interfaces and/or interface regions) of these subdomains (e.g., partitions), preprocessing module 106 may use a 6th order finite difference stencil to patch two subdomains together. A 6th order scheme was chosen because has been experimentally determined [19] to produce reflection errors at 40 dB below the incident sound field. The stencil may be derived as follows.

First, the projection along an axis of two neighboring axis-aligned cuboids is examined. The local solution inside the cuboids assumes a reflective boundary condition, $$\left.\frac{\partial p}{\partial x}\right|_{x=0} = 0.$$

Looking at the rightmost cuboidal partition, the solution can be represented by the discrete differential operator, $\nabla_{local}^2$, that satisfies the boundary solutions. Referring back to the wave equation, the global solution may be represented as:

$$\frac{\partial^2 p}{\partial t^2} - c^2 \nabla_{global}^2 p = f(X, t).$$

Using the local solution of the wave equation inside the cuboid ($\nabla_{local}^2$), the following is derived:

$$\frac{\partial^2 p}{\partial t^2} - c^2 \nabla_{local}^2 p = f(X, t) + f_I(X, t),$$

where $f_I(X,t)$ is the forcing term that needs to be contributed by the interface to derive the global solution. Therefore, this term is solved using the two previous identities:

$$f_I(X,t) = c^2(\nabla_{global}^2 - \nabla_{local}^2)p. \quad (7)$$

While the exact solution to this is computationally expensive, the solution can be approximated using a 6th order finite difference stencil, with spatial step size h:

$$f_I(x_j) = \sum_{i=j-3}^{-1} p(x_i)s[j-i] - \sum_{i=0}^{2-j} p(x_i)s[i+j+1], \quad (8)$$

where $j \in [0, 1, 2]$, $f_I(x_j) = 0$ for $j > 2$, and $$s[-3 \ldots 3] = \frac{1}{180 h^2}\{2, -27, 270, -490, 270, -27, 2\}.$$

In general, the ARD technique includes two main stages: Preprocessing and Simulation. During the preprocessing stage (which may be conducted by preprocessing module 106 when executed by one or more processors), the input scene is voxelized into grid cells. The spatial discretization of the grid h can be determined by the maximum simulation frequency $v_{max}$ determined by the relation $h = c/(v_{max}s)$, where s is the number of samples per wavelength (=2.66 for ARD) and c is the speed of sound (343 m/sec at standard temperature and pressure). The next step is the computation of adaptive rectangular decomposition, which groups the grid cells into rectangular (cuboidal) domains. These generate the partitions, also known as air partitions. Pressure-absorbing layers may be created at the boundary by generating Perfectly-Matched-Layer (PML) partitions. These partitions are needed to model partial or full sound absorption by different surfaces in the scene (e.g., the acoustic space). Artificial interfaces are created between the air-air and the air-PML partitions to propagate pressure between partitions and combine the local pressure fields of the partitions into the global pressure field.

Figure 2:
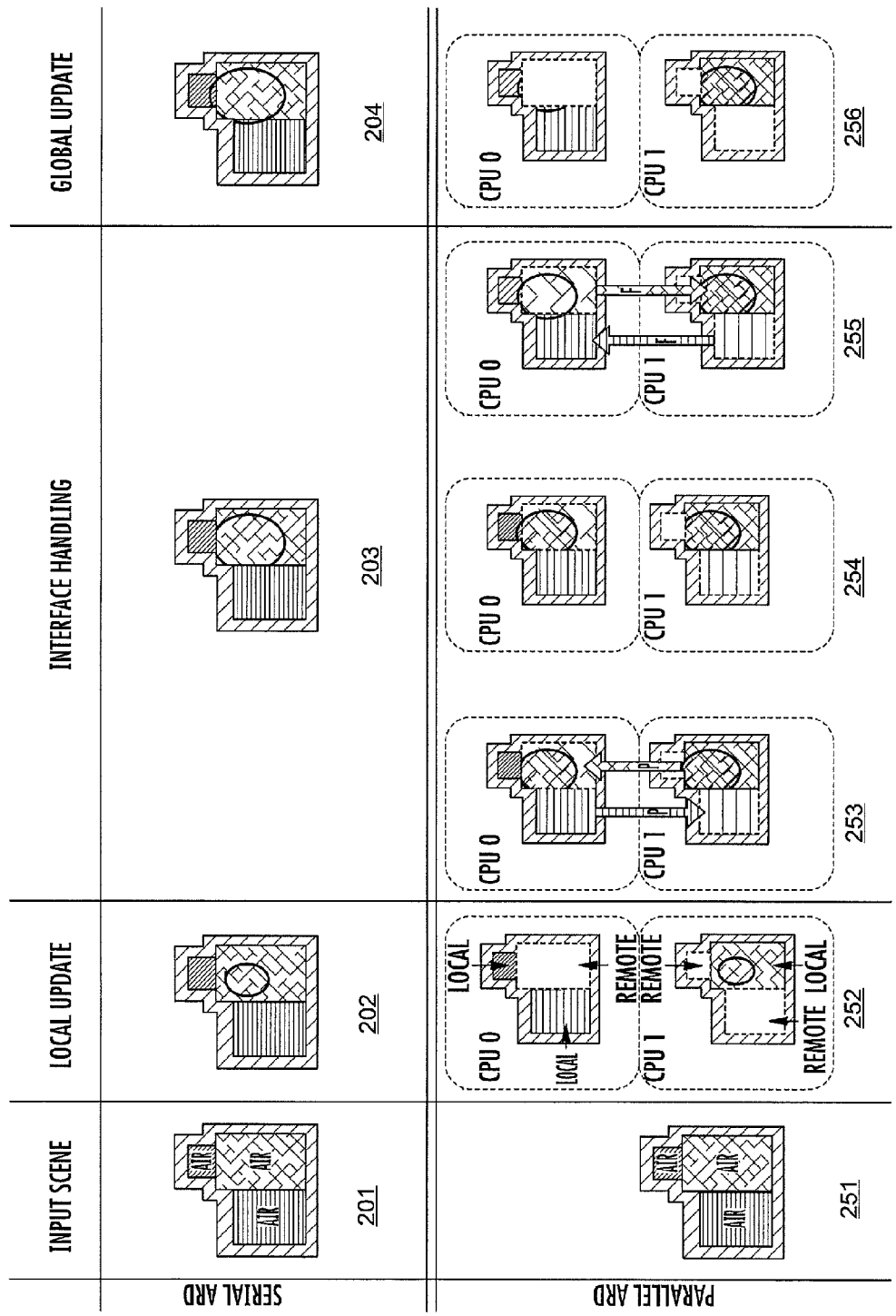
FIG. 2 is a diagram illustrating a serial ARD pipeline and a parallel ARD pipeline according to an embodiment of the subject matter described herein.

During the simulation stage, the global acoustic field is computed (e.g., which may be conducted by simulation module 108 when executed by one or more processors) in a time-marching scheme as follows. Further, FIG. 2 provides a depiction if the computation of a global acoustic field using serial ARD. Namely, stage 201 (see FIG. 2, top row) depicts the input (e.g., an acoustic scene) into the system. Stage 202 depicts an analytical-solution update (e.g., a local update) in the rectangular partitions and pressure updates in the PML partitions. For example, a local update in stage 202, for all air partitions, may include (a) Computing the DCT to transform force F to $\tilde{F}$, (b) Updating mode coefficients $M_i$ using update rule, and (c) Transforming $M_i$ to pressure P using iDCT. In addition, for all PML partitions, the pressure field of the PML absorbing layer is updated. More specifically, stage 202 solves the wave equation in each rectangular region by taking the Discrete Cosine Transform (DCT) of the pressure field, updating the mode coefficients using the update rule, and then transforming the mode coefficients back into the pressure field using inverse Discrete Cosine Transform (iDCT). Both the DCT and iDCT are implemented using fast Fast Fourier Transforms (FFT) libraries. Overall, stage 202 step involves two FFT evaluations and a stencil evaluation corresponding to the update rule. The pressure fields in the PML-absorbing layer partitions are also updated in this step.

Stage 203 in FIG. 2 illustrates and interfacing handling stage. For example, stage 203 may, for all interfaces, compute the forcing term F within each partition. In some embodiments, stage 203 may use a finite difference stencil to propagate the pressure field between partitions. This involves a time-domain stencil evaluation for each grid cell on the boundary.

Lastly, stage 204 depicts the global pressure-field update in which the forcing terms computed in the interface handling stage are used to update the global pressure field.

In accordance with embodiments of the subject matter described herein, parallel ARD simulation module 108 may be configured to determine, for each of a plurality of processors (e.g., processors $102_{1 \ldots N}$), pressure field data corresponding to the one or more assigned partitions and to compel each processor to transfer the pressure field data to at least one remote processor that is assigned to a partition that shares an interface with at least one partition assigned to the transferring processor. In some embodiments, parallel ARD simulation module 108 may also be configured to cause each remote processor to compute forcing term values using the pressure field data received from other processors. In some embodiments, parallel ARD simulation module 108 may be configured to compel each processor to receive the forcing term values that have been derived by the at least one remote processor using the pressure field data. Similarly, parallel ARD simulation module 108 may be configured to compel each processor to utilize the received forcing term values to calculate at least one local partition pressure field that is used to update a global pressure field associated with the acoustic space.

In some embodiments, an ARD-based distributed parallel acoustic simulator (e.g., node 101 in FIG. 1) may be configured to perform ARD-based acoustic simulations. For example, preprocessing module 106 may be configured to distribute the problem domain (e.g., the acoustic space) onto the cores (e.g., processors $102_{1 \ldots N}$) of the cluster. In the case of ARD, the acoustic scene/space may include different domains such as air partitions, PML partitions, and the interfaces. This stage is further depicted in stage 251 in FIG. 2.

In some embodiments, the ARD solver can be parallelized because the partition updates for both the air and the PML partitions are independent at each time step. Namely, each partition update is a localized computation that does not depend on the data associated with other partitions. As a result, partitions can be distributed onto separate processor cores of the cluster and the partition update step is evaluated in parallel at each time step without needing any communication or synchronization. In other words, each processor core exclusively handles a set of partitions. These local partitions compute the full pressure field in memory 106. The rest of the partitions are marked as remote partitions for this processor core and may be evaluated by other processor cores of the cluster. Only metadata (size, location, etc.) for remote partitions needs to be stored on the current core, using only a small amount of memory (see stage 252 in FIG. 2).

Interfaces, like partitions, can retain the concept of ownership. One of the two processor cores that owns the partition of an interface, takes ownership of that interface, and is responsible for performing the computations with respect to that interface. Unlike the partition update, the interface handling step has a data dependency with respect to other cores. Before the interface handling computation is performed, pressure data needs to be transferred from the dependent cores to the owner ((see stage 253 in FIG. 2). Afterwards, the pressure data is used, along with the source position, to compute the forcing terms (see stage 254 in FIG. 2). Once the interface handling step is completed, the interface-owning core must send the results of the force computation back to the dependent cores (see stage 255 in FIG. 2). Lastly, the global pressure field is updated (see stage 256 in FIG. 2) and used at the next time step.

Thus, the overall parallel ARD technique may proceed in discrete time steps (as shown in the bottom row of FIG. 2). Each time step in the parallel ARD algorithm (which may be embodied as preprocessing module 106 when executed by one or more processors 102) is similarly evaluated through three main stages (e.g., local update, interface handling, and global update) described in the serial and/or parallel ARD computation pipeline described above. In some embodiments, these evaluations are followed by a barrier synchronization conducted at the end of the time step. Each processor core starts the time step at the same time and subsequently proceeds along the computation without synchronization until the end of the time step. In some embodiments, a local update may be conducted in order to update the pressure field in the air and PML partitions for each core independently, as described above. After an air partition is updated, the resulting pressure data may be sent to all interfaces that require it. This data can be sent as soon as it is available (e.g., asynchronously). Next, an interface handling stage may use the pressure transferred in the previous stage to compute forcing terms for the partitions. Before the interface can be evaluated, it needs data from all of its dependent partitions. After an interface is computed, the owner (e.g., processor core) needs to transfer the forcing terms back to the dependent processor cores. A core receiving forcing terms can then use them as soon as the message is received. Afterwards, a global update may be conducted via each processor core updating the pressure field using the forcing terms received from the interface operators. In some embodiments, a barrier synchronization technique may be conducted. Notably, a barrier may be needed at the end of each time step to ensure that the correct pressure and forcing values have been computed. This is necessary before a local update is performed for the next time step.

Returning to FIG. 1, parallel ARD simulation module 108 may be configured to coordinate each of the aforementioned function (e.g., assigning, determining, transferring, receiving, and utilizing elements set forth above) in such a manner that each of the processors $102_{1...N}$ performs the functions/steps within a discrete time step. Similarly, parallel ARD simulation module 108 may further leverage the discrete time step mechanism to utilize the barrier synchronization technique to conduct the parallel ARD functionality in a manner that ensures that the correct pressure data and forcing term values have been computed.

As indicated above, memory 104 may further include load balancing module 110. In some embodiments, load balancing module 110 may be configured to conduct measures to prevent potential suboptimal performances caused by the barrier synchronization technique employed by the system. For example, load balancing module 110 may utilize an algorithm that divides an orthogonal plane that separates an original partition from among the plurality of partitions into two partitions. Notably, the first partition of the two partitions may be equal to Q, where Q is a volume that does not exceed a value equal to a total volume of the acoustic scene (e.g., acoustic space) divided by a number representing the plurality of processors. Similarly, the second partition of the two partitions may be set equal to a difference between a volume of the original partition and Q. After new partitions are generated (from an original larger partition), preprocessing module 106 and/or load balancing module 110 may be configured to reassign, to each of the plurality of processors, ARD processing responsibilities associated with one or more of a plurality of partitions that now includes the two new partitions.

For example, for each time step, the computation time is proportional to the time required to compute all of the partitions. This implies that a processor core with larger partitions or more partitions than another core would take longer to finish its computations. This would lead to load imbalance in the system, causing the other processor cores of the cluster to wait at the synchronization barrier instead of doing useful work. Load imbalance of this kind results in suboptimal performance.

Imbalanced partition sizes in ARD are rather common since ARD's rectangular decomposition step uses a "greedy scheme or algorithm" based on fitting the biggest possible rectangle at each step. This can generate a few big partitions and large number of small partitions. In a typical scene, the load imbalance can result in poor performance.

A naive load balancing scheme would reduce the size of each partition to exactly one voxel, but this would negate the advantage of the rectangular decomposition scheme's use of analytical solutions; furthermore, additional interfaces introduced during the process at partition boundaries would reduce the overall accuracy of the simulator [22]. The problem of finding the optimal decomposition scheme to generate perfect load balanced partitions while minimizing the total interface area is non-trivial. This problem is known in computational geometry as ink minimization[16]. While the problem can be solved for a rectangular decomposition in two dimensions in polynomial time, the three-dimensional case is NP-complete [12]. As a result, we approach the problem using a top-down approximate technique that bounds the sizes of partitions and subdivides large ones yet avoids increasing the interface area significantly. This is different from a bottom-up approach that would coalesce smaller partitions into larger ones.

The approach splits the partitions that exceed a certain volume $$Q = \frac{V}{f \text{num\_procs}},$$

where V is the total volume of the simulation domain, num_procs is the number of cores available, and f is the load balancing factor (typically 1-4, but in this implementation and associated results, f=1 is used). To split the partition, we find a dividing orthogonal plane that separates the partition $p_i$ into two partitions of size at most Q and of size volume $(p_i)$–Q. Both are added back into the partition list. The splitting operation is repeated until no partition is of size greater than Q. Once all the large partitions are split, we allocate partitions to cores through a greedy bin-packing technique. The partitions are sorted from the greatest volume to least volume, then added to the bins (where one bin represents a core) in a greedy manner. The bin with the maximum available volume is chosen during each iteration (see algorithm 1 depicted below).

---

Algorithm 1 Load balanced partitioning

---

Require: list of cores B, list of partitions P
Require: volume threshold Q
 {Initialization}
 1: for all b ∈ B do
 2:   b ← Q
 3: end for
 {Splitting}
 4: while ∃$p_i$ ∈ P where volume($p_i$) > Q do
 5:   P ← P – {$p_i$}
 6:   ($p_i'$,$q_i'$) ← split $p_i$
 7:   P ← P ∪ {$p_i'$,$q_i'$}
 8: end while
 {Bin-packing}
 9: sort P from greatest to the least volume
10: for all $p_i$ ∈ P do
11:   volume(b) ← max volume(B)
12:   assign $p_i$ to core b
13:   volume(b) ← volume(b) – volume($p_i$)
14: end for

---

In some embodiments, preprocessng module and/or the simualtion module 108 may be configured in a manner to reduce communication costs. For example, each interface in a simulation depends on the data from two or more partitions in order to evaluate the stencil. In the worst case, when the partitions are very thin, the stencil can cross over multiple partitions. This dependence means that data must be transferred between the cores when the dependent partition and the interface are in different cores.

In order to reduce the cost of this data transfer, an asynchronous scheme may be used where each processor core can evaluate a partition while waiting for another processor core to receive partition data, effectively overlapping communication and computation costs.

As the problem size grows, the communication cost increases. However, the communication cost grows with the surface area of the scene, while computation grows with the volume. Therefore, computation dominates at higher problem sizes and can be used effectively to hide communication costs.

It will be appreciated that FIG. 100 is for illustrative purposes and that various nodes, their locations, and/or their functions may be changed, altered, added, or removed. For example, some nodes and/or functions may be combined into a single entity. In a second example, a node and/or function may be located at or implemented by two or more nodes.

The subject matter described herein may be utilized for performing sound rendering or auditory displays which may augment graphical renderings and provide a user with an enhanced spatial sense of presence. For example, some of the driving applications of sound rendering include acoustic design of architectural models or outdoor scenes, walkthroughs of large computer aided design (CAD) models with sounds of machine parts or moving people, urban scenes with traffic, training systems, computer games, and the like.

In some embodiments, the present subject matter may be implemented using a simulation machine (e.g., node 101 in FIG. 1) on a distributed memory architecture, and highlight its performance on various indoor and outdoor scenes. For example, a CPU cluster with 119 Dell C6100 servers or 476 compute nodes, each node with 12-core, 2.93 GHz Intel processors, 12 M L3 cache, and 48 GB of physical memory may be used. All the nodes of the cluster are connected by Infiniband (PCI-Express QDR) interconnect.

Further, in some embodiments, the preprocessing stage is single threaded and run in two steps. The first step is the voxelization, which can be done in seconds even on very complex scenes. The second step, partitioning, can be done within minutes or hours depending on the scene size and complexity. However, this is a one time cost for a specific scene configuration. Once we have a partitioning, the present subject matter can further upsample and refine the voxel grid to simulate even higher frequencies. However, doing so will smooth out finer details of the mesh. This allows us to run the preprocessing step only once for a scene at different frequency ranges.

In some embodiments, an simulator initialization step is run on all partitions, determining which interfaces the partitions belong to and whether or not the partitions will receive forcing terms back from the interface. Therefore, each processor core knows exactly which other processor cores it should send data to and receive from, thereby allowing messages to be received from other cores in no particular order. This works hand in hand with the independence of operations and interfaces can be handled in any order depending on which messages are received first.

In some embodiments, interface handling optimizations may be conducted. In scenes with a large number of interfaces on separate processor cores, the amount of data that is sent between cores can rapidly increase. Although a partition stores the pressure and forcing data, the interface handling computation only needs the pressure as an input and generates the forcing data as the output. Therefore, only half of the data at the surface of the partition needs to be sent and received.

The present subject matter may send partition messages using an asynchronous communication strategy instead of a collective communication approach. Asynchronous communication allows the present subject matter to send messages while computation is being performed. The collective communication approach requires that all cores synchronize at the data-transfer call (since each core needs to both send and receive data), causing some cores to wait and idle.

In order to evaluate the parallel algorithm, five benchmark scenes were utilized. The first, Cube, is an optimal and ideal case, designed to show the maximum scalability of the simulator with frequency and volume. It is perfectly load-balanced and contains a minimum number of interfaces. The second scene, Cathedral, was chosen for its spatial complexity. Cathedral is a large indoor scene that generates partitions of varying sizes: many large-sized partitions (which can cause load imbalance) and a large number of tiny partitions and interfaces. The third scene, Twilight, is the Twilight Epiphany skyspace from Rice University. The main feature of the scene is its sloped surfaces, which can cause the generation of smaller partitions. The fourth scene, Village, is a huge open area with scattered buildings. This outdoor scene is useful since it can generate very large partitions. This can cause problems for a simulator that does not handle load imbalance properly. The final scene, KEMAR, is a head model used to simulate how acoustic waves interact with the human head. The fine details of the human head (esp. ears) cause the generation of very small partitions. The scene is small (only 33 $m^3$) and can be simulated up to 22 kHz.

The present subject matter may further include a Massively Parallel Adaptive Rectangular Decomposition (MPARD) method that may comprise a parallel time-domain acoustic wave solver designed for large computing clusters of thousands of CPU cores. Notably, this MPARD approach is based on a novel scalable method for dividing acoustic field computations over large distributed memory clusters using parallel Adaptive Rectangular Decomposition (ARD). In order to take full advantage of the compute resources of large clusters, a hypergraph partitioning scheme to reduce the communication cost between cores on the cluster is introduced. Additionally, the present subject matter further includes a novel domain decomposition scheme that reduces the amount of numerical dispersion error introduced by a load balancing algorithm. Further, a novel pipeline for parallel ARD computation that increases memory efficiency and reduces redundant computations is disclosed. Notably, the resulting parallel algorithm makes it possible to compute the sound pressure field for high frequencies in large environments that are thousands of cubic meters in volume.

In some embodiments, the present subject matter may be configured to perform a MPARD technique that comprises a new parallel pipeline for the ARD method and is designed to run on tens of thousands of processor cores (e.g., processors $102_{1...N}$ in FIG. 1). For example, preprocessing module 106 in FIG. 1 may be configured to facilitate a parallel pipeline that includes a modified subdomain assignment scheme that takes into account the communication costs between processor cores, a modified domain decomposition and splitting stage that can increase numerical stability, and new preprocessing stages for computing metadata for interfaces and PML subdomains as described below.

In some embodiments, each interface in a scene (e.g., an acoustic space) covers two or more subdomains (e.g., if the subdomains on either side are especially thin, the 6th order stencil may cover more than two). When subdomains (e.g., partitions) on an interface are owned by (e.g., assigned to) different cores, the pressure terms required by the interface and the forcing terms generated by the interface need to be communicated.

In some embodiments, preprocessing module 106 facilitating MPARD may use asynchronous communication calls to avoid blocking while messages between processor cores are being sent. When a processor core completes an operation (e.g., either a subdomain/partition update or an interface update), the processor core can send off a message to the other processor cores that require the computed results. Notably, the sending processor core does not have to wait for the message to be received and can continue working on the next computation. When receiving data, a processor core can place the message on an internal queue until the core needs the data for that operation. As a particular core finishes working on a subdomain, the core sends off an asynchronous communication message to the other cores that require the pressure field data of that subdomain for interface computation. As the message is being sent, that particular core begins to process the next subdomain and sends a message upon completion. During this time, a receiving processor core is processing its own subdomains. The incoming message is stored by the receiving processor core on an internal queue for use when needed. The sending core therefore is not affected by or concerned about when the message is received.

In the event a processor core completes the updating of a rectangular region, the processor core waits until it has the pressure fields (e.g., pressure field data) from the remote subdomains available. It evaluates the first available interface, asynchronously sending back the forcing terms as soon as the stencil is evaluated. This allows the system to effectively hide the communication costs. By using this system of queues and a "fire and forget" method of sending messages, the only explicit synchronization is the barrier at the end of the time step. This barrier is necessary to ensure the algorithm's correctness. For example, FIG. 3 shows a flow chart of one time step of MPARD, laying out the asynchronous message passing calls for transferring pressure and forcing terms.

Figure 3:
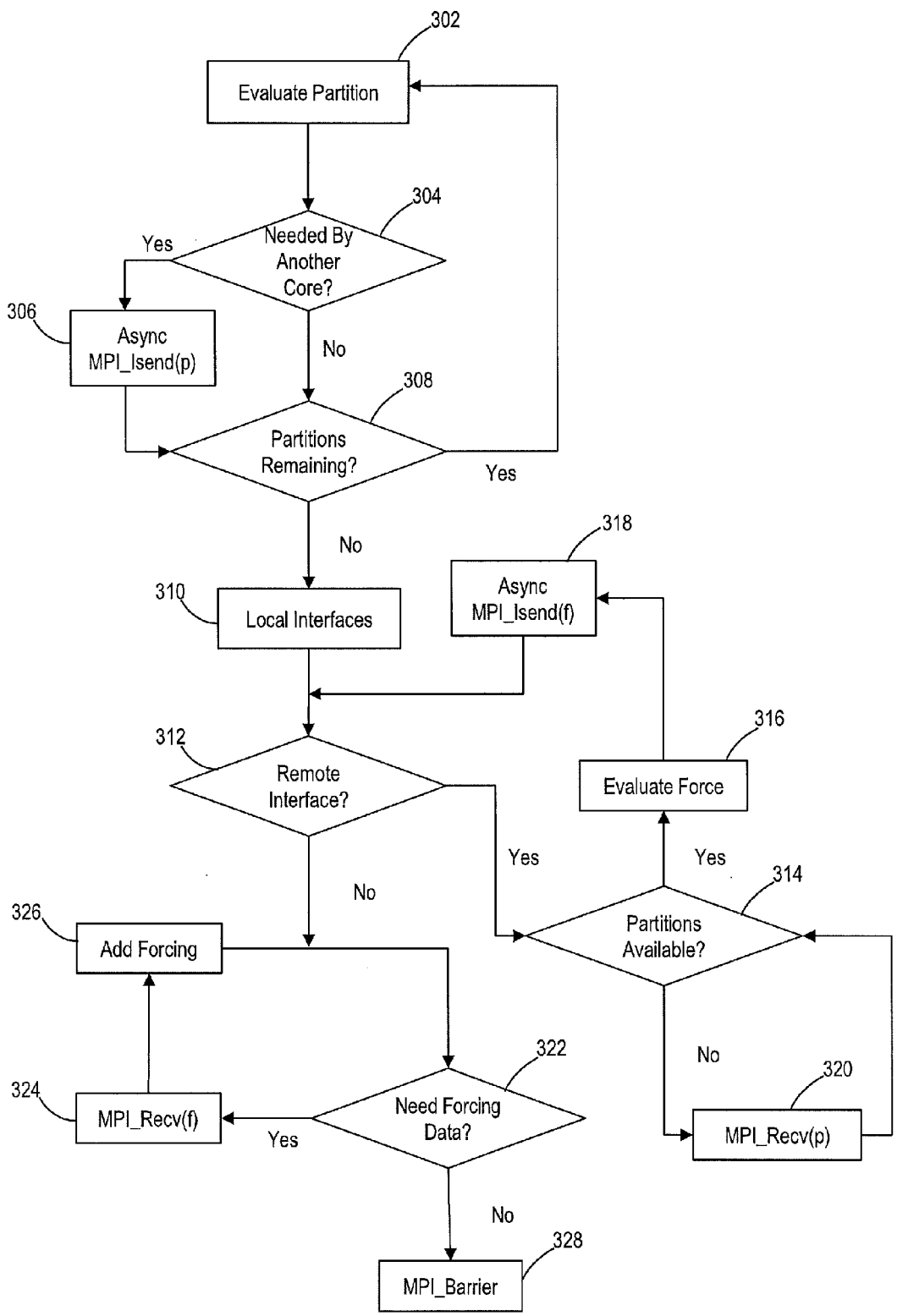
FIG. 3 is a flow chart of one time step of the main loop of the parallel ARD technique implemented on a single processor core according to an embodiment of the subject matter described herein.

FIG. 3 is a flow chart of a process 300 representing the one time step of the main loop of the parallel ARD technique implemented on a single processor core according to an embodiment of the subject matter described herein. Referring to step 302 of FIG. 3, a partition is evaluated (e.g., by a processor core executing module 106 and/or 108). In particular, step 302 is the local update of the pressure inside a local subdomain. Process 300 continues to step 304 where a determination is made as to whether or not the local update data is needed by another processor core. More specifically, a processor core may be configured to check if the results of the local update are needed by another processor core for interface evaluation. If yes, then process 300 continues to step 306 where the processor core asynchronously sends local update information (e.g., via message passing interface (MPI) messages) to the other processor core for interface evaluation. Otherwise, process 300 proceeds to step 308 where a determination is made as to whether any partitions that need to be evaluated are remaining. Notably, step 308 will loop back to step 302 as long as the processor core still has partitions that require evaluation. If no partitions needing evaluation remain, process 300 continues to step 310 where the processor core evaluates all local interfaces that do not need subdomain pressure data from another core.

At step 312, a determination is made as to whether or not the interface being evaluate is remote and needs pressure data from another processor core. If yes, process 300 continues to step 314 where a determination is made as to whether there are any partitions available (see more below). If no, then process 300 proceeds to step 322 where a determination is made as to whether forcing data and/or terms are needed. If forcing data is not needed, then process 300 continues to step 328 where the processor core waits for all of the other processor cores to complete the evaluation of the global solution for the time step. If forcing data is needed, then process 300 continues to step 324 which attempts to receive the forcing data. Process 300 subsequently continues to step 326 where the forcing terms and/or data is added in order to compute the global pressure solution in a subdomain.

Returning to step 314, if it is determined that there are no partitions available, process 300 continues to step 320 where an MPI message is sent as an attempt to receive subdomain pressure data. If it is determined that there are partitions available in step 314, process 300 continues to step 316 where pressure data is evaluated. For example, step 316 occurs when all pressure data needed by an interface evaluation is available and the interface is evaluated. Process 300 proceeds to step 318 where the forcing terms outputted by interface evaluation are asynchronously sent back to the sending processor core(s).

In general, ARD's communication cost of evaluating all the interfaces is proportional to the surface area of the rectangular region while the cost of evaluating each subdomain is proportional to the volume of the subdomain. This implies an approximate $O(n^2)$ running time for interface evaluation (where n is the length of one side of the scene) while local update has an $O(n^3)$ running time. This means that as the size of the scene or the simulation frequency increases, the computation cost of local update dominates over the communication cost of transferring pressure and forcing values for interface evaluation. Conversely, the finer grid size of larger complex scenes can introduce many more interfaces which causes an increase in the cost of communication.

In order to evaluate these interfaces, communication is only required when resolving the interface between two or more subdomains that lie on different cores. As a result, minimizing the number of these interactions can greatly reduce the total amount of communicated data.

This can be performed by ensuring that neighboring subdomains that are part of the same interface are located on the same processor core. Due to the complexity of the scene and the interactions between different rectangular regions, this may not be feasible. However, a heuristic can be used to minimize the number of interfaces that span across multiple cores.

Figure 4:
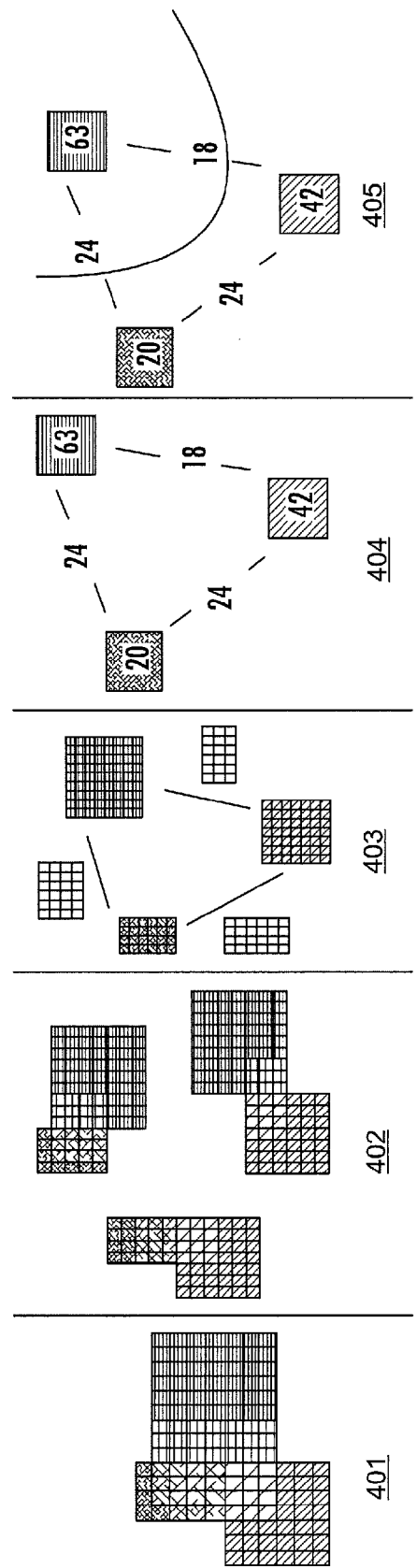
FIG. 4 is a diagram illustrating the relationship between computational elements of MPARD and a hypergraph structure according to an embodiment of the subject matter described herein.

FIG. 4 illustrates the relationship between computational elements of MPARD (e.g., rectangular subdomains and interfaces) and the hypergraph structure. For example, stage 401 shows an example scene of three subdomains with three interfaces, as shown in stage 402. The organization of the resulting hypergraph is shown in stage 403, while stage 404 shows the hypergraph with the node weights determined by the sizes of the rectangles and the hyperedge weights determined by the size of the interfaces. Stage 405 shows an example partitioning of the simple graph, taking into account both the computation cost of each node and the cost of each interface.

This problem can be reworded as a hypergraph partitioning problem. For example, a hypergraph can be represented as the pair H=(X,E) where X represents the nodes of the hypergraph are the rectangular regions of the decomposition, while the hyperedges E represent the interfaces between the rectangular regions. In some embodiments, Hyperedges may be used instead of regular edges because an interface (or interface region) can actually cover up to six different subdomains.

The goal of the hypergraph partitioning algorithm (which may constitute a portion or part of preprocessing module 106) is to divide the hypergraph into k regions such that the cost function of the hyperedges spanning the regions is minimized [38]. In ARD, the partitioning algorithm can be run (e.g., module 106 executed by one or more processors 102) to divide the computational elements (e.g., interfaces and rectangles) into k regions, where k is the number of processors used in the simulation. As a result, the interface cost between cores is minimized.

Additionally, because the hypergraph partitioning algorithm attempts to generate k regions of equal cost, the heuristic serves as a way of load balancing the assignment of work among the processor cores. The cost of evaluating a rectangular region is linearly related to the volume of the region. Therefore, the volume of each rectangular subdomain is inputted as the weight parameter for a node in the hypergraph.

As indicated above, the splitting algorithm for load balancing introduced in parallel ARD minimizes the number of extra interfaces created by splitting partitions and/or subdomains in some instances. In some embodiments, the splitting algorithm may produce two or more subdomains (e.g., partitions) wherein at least one of the resulting subdomains includes a size that is exactly below the maximum volume threshold of the splitting algorithm.

However, on a cluster with a higher number of processor cores and where the volume threshold can be relatively small, this splitting algorithm can introduce a series of very small and thin rectangles. Small and thin rectangles can create numerical instability during interface resolution. The interface solver uses a (2,6) FDTD scheme. However, in the scenario where a series of thin interfaces with a width of one voxel are next to each other, the pressure computation devolves into the (2,6) FDTD scheme, but does not have a small enough grid size for the method to be stable. The lack of sufficient grid size for the FDTD stencil can cause the numerical instability in the overall system.

In this particular scenario, it is more advantageous to have well-formed rectangular subdomains (or partitions) that may introduce more interface area rather than degenerate rectangles which can result in numerical issues.

A new splitting scheme is introduced by the present subject matter for load balancing that is particularly useful for reducing numerical instability at interfaces for higher numbers of processor cores. Notably, the new approach favors well-formed subdomains that are roughly cuboidal in shape rather than long and thin rectangles.

Each rectangular region that has a volume greater than some volume threshold Q is subdivided by the new algorithm. Q is determined by the equation:

$$Q = \frac{V}{pf},$$

where V is the total air volume of the scene in voxels, p is the number of cores the solver is to be run on, and f is the balance factor. It is usually the case that f=1, although this can be changed to a higher value if smaller rectangles are desired for the hypergraph partitioning heuristic (see below).

As indicated above, one notable step of the ARD and parallel ARD methods includes the initialization of interfaces (e.g., interface regions) and PML regions. This generally involves determining subdomain adjacency and which voxels are included in an interface. This computation is linear with respect to the number of voxels in the scene. That is, it scales linearly with the volume of the scene and with the 4 power of frequency. At higher frequencies, the interface and PML setup can consume several hours of time before any actual simulation steps are run.

In order to reduce the running time of the simulation, MPARD introduces a new preprocessing step in which the interfaces can be initialized offline. This preprocessing step occurs after any splitting and load balancing, after the decomposition for the scene is final.

Additionally, this extra preprocessing step allows for further memory optimization in MPARD. With the kind of global metadata computed in the preprocessing, each core only needs to load the exact interfaces and PML regions it needs for its computations.

Figure 5:
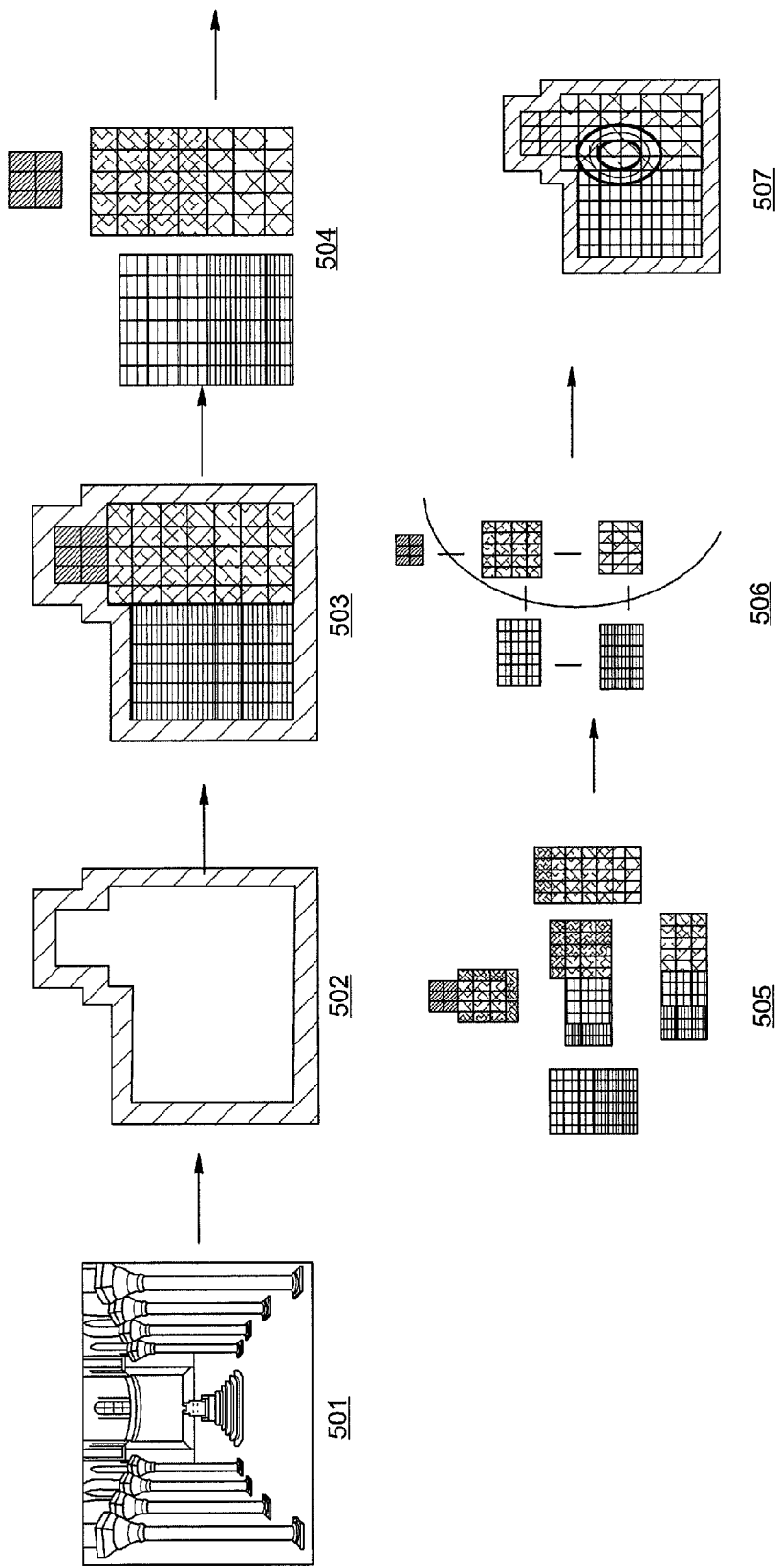
FIG. 5 is a diagram of an exemplary MPARD pipeline according to an embodiment of the subject matter described herein.

The MPARD pipeline introduces new preprocessing stages and a modified simulation stage. The pipeline overview can be found in FIG. 5. The scene input and/or the input geometry (stage 501 in FIG. 5) is first voxelized (stage 502 in FIG. 5). Next, the rectangular decomposition fills the available air space with rectangular subdomains using a greedy algorithm (stage 503 in FIG. 5). For example, the rectangular decomposition step divides the domain into multiple non-overlapping subdomains (and/or partitions). Next, the new splitting algorithm that avoids degenerate subdomains splits rectangular regions that are larger than the volume threshold (stage 504 in FIG. 5). For example, this splitting step then splits these subdomains when they are greater than the volume threshold Q. In some embodiments, the interface regions are calculated (stage 505 in FIG. 5). For example, these partitions may be processed by the interface initialization stage which computes interface metadata. Afterwards, subdomains are assigned to cores using hypergraph partitioning (stage 506 in FIG. 5). Finally, the solver reads the preprocessing data and runs the simulation for a set number of time steps (stage 507 in FIG. 5).

In one embodiment, a hypergraph partitioning scheme was implemented through the PaToH (i.e., Partitioning Tool for Hypergraphs) library in order to minimize core-to-core communication and equally distribute computation load across all cores[38]. There are many customizable parameters to adjust the details of how nodes are partitioned. As such, the "connectivity" (PATOH_CONPART) and "quality" metrics (PATOH_SUGPARAM_QUALITY) were used, which sacrifice speed for better partitioning. This heuristic was repeatedly executed until a satisfactory subdomain assignment is achieved (e.g., no unassigned cores or subdomains).

The rectangular regions were passed into the PaToH partitioner as vertices with weights equal to the respective subdomain volumes. The hyperedges are defined by the interfaces connecting separate subdomains. By executing PaToH hypergraph partitioning onto this representational graph, the resulting core assignments will tend to prioritize low data transfer over cores, since it attempts to assign vertices in close proximity to a shared core. This also allows for a balanced load distribution by assigning each core roughly equal volume, which is linearly related to computation time.

Both hypergraph partitioning and the subdomain splitting are implemented in the preprocessor stage. This is possible because the scenes targeted by MPARD are static and since the 3D arrangement of subdomains and interfaces are known beforehand. As a result, run-time simulation costs of dynamically updating the hypergraph or dynamically subdividing rectangular regions are avoided.

The preprocessing pipeline in MPARD is separated into four stages: voxelization, decomposition, core allocation/splitting, and interface/PML preprocessing. In some embodiments, the voxelization stage takes in a triangle mesh representing the environment in which we want to compute the sound propagation. Because MPARD targets large and high frequency scenes that may consume a large amount of memory, a CPU method for voxelization may be used.

The spatial discretization for the voxelization can be determined by the minimum simulated wavelength and the required number of spatial samples per wavelength, which is typically between 2 and 4 [22]. Therefore, the voxelization only needs to be run once per desired maximum frequency.

In some embodiments, the decomposition stage subsequently reads the voxel field and determines the location of the different cuboidal subdomains. The process is a greedy approach (e.g., utilizes a greedy algorithm) that attempts to expand each rectangular subdomain into as large a volume as possible under the constraints of the wall voxels.

At very high frequencies, such as 10 kHz, this process can take several days to complete but only needs to run once for a given voxel input.

The next stage of the preprocessing is the core allocation and subdomain splitting stage. In addition to a decomposition computed in the previous stage, this step also requires the number of cores the solver will run on. This stage uses the input values to compute a hypergraph partitioning for the decomposition in addition to splitting any rectangular regions that have volumes greater than the volume threshold Q.

The core allocation stage then determines the assignment of subdomains to cores by using the hypergraph partitioning assignment or alternatively a simple bin-packing algorithm. This load balancing step ensures that each core has a roughly equal amount of work to complete during the acoustic simulation. In some embodiments, the allocation and splitting stage must be run for each decomposition for each desired core configuration.

The final stage of preprocessing computes interfaces (e.g., interface regions) and creates PML regions from wall voxels. This stage takes as input a modified decomposition from the core allocation and splitting stage in addition to a refinement parameter r that can be used to subdivide voxels in the final acoustic simulation. This permits running at r times the frequency in which the decomposition was run. However, this is conducted at the expense of some accuracy where high frequency geometric features of the scene that may affect sound propagation cannot be accurately represented.

One additional caveat of the interface and PML preprocessing file is file read performance in the simulator. The interface file can be several GBs in size, and thousands of CPU cores reading the file can cause a bottleneck. As a solution, the file striping feature of the Lustre file system [44] may be used to increase file read performance over all cores. The interface and PML initialization stage only needs to be run once for each core configuration.

It will be understood that various details of the subject matter described herein may be changed without departing from the scope of the subject matter described herein. Furthermore, the foregoing description is for the purpose of illustration only, and not for the purpose of limitation, as the subject matter described herein is defined by the claims as set forth hereinafter.

The disclosure of each of the following references is incorporated herein by reference in its entirety.

REFERENCES

[1] Amal Alghamdi, Aron Ahmadia, David I Ketcheson, Matthew G Knepley, Kyle T Mandli, and Lisandro Dalcin. Petclaw: A scalable parallel nonlinear wave propagation solver for python. In *Proceedings of the 19th High Performance Computing Symposia*, pages 96-103. Society for Computer Simulation International, 2011.

[2] Jon B Allen and David A Berkley. Image method for efficiently simulating small-room acoustics. *The Journal of the Acoustical Society of America*, 65(4):943-950, 1979.

[3] Hesheng Bao, Jacobo Bielak, Omar Ghattas, Loukas F Kallivokas, David R O'Hallaron, Jonathan R Shewchuk, and Jifeng Xu. Large-scale simulation of elastic wave propagation in heterogeneous media on parallel computers. *Computer methods in applied mechanics and engineering*, 152(1):85-102, 1998.

[4] Marc Bernacki, Loula Fezoui, Stephane Lanteri, and Serge Piperno. Parallel discontinuous galerkin unstructured mesh solvers for the calculation of three-dimensional wave propagation problems. *Applied mathematical modelling*, 30(8):744-763, 2006.

[5] Milind A Bhandarkar and Laxmikant V Kalé. A parallel framework for explicit fem. In *High Performance ComputingÅ—HIPC 2000*, pages 385-394. Springer, 2000.

[6] Stefan Bilbao. Modeling of complex geometries and boundary conditions in finite difference/finite volume time domain room acoustics simulation. *Audio, Speech, and Language Processing, IEEE Transactions on*, 21(7): 1524-1533, 2013.

[7] Tony F Chan and Tarek P Mathew. Domain decomposition algorithms. volume 3, pages 61-143. Cambridge Univ Press, 1994.

[8] Jeng-Tzong Chen, Ying-Te Lee, and Yi-Jhou Lin. Analysis of mutiple-shepers radiation and scattering problems by using a null-field integral equation approach. *Applied Acoustics*, 71(8):690-700, 2010.

[9] Robert D Ciskowski and Carlos Alberto Brebbia. *Boundary element methods in acoustics*. Computational Mechanics Publications Southampton, Boston, 1991.

[10] Malcolm J. Crocker. *Handbook of acoustics*. John Wiley & Sons, 1998.

[11] Ralf Diekmann, Uwe Dralle, Friedhelm Neugebauer, and Thomas Römke. Padfem: a portable parallel fem-tool. In *High-Performance Computing and Networking*, pages 580-585. Springer, 1996.

[12] Victor J Dielissen and Anne Kaldewaij. Rectangular partition is polynomial in two dimensions but np-complete in three. *Information Processing Letters*, 38(1):1-6, 1991.

[13] Björn Engquist and Olof Runborg. Computational high frequency wave propagation. *Acta numerica*, 12:181-266, 2003.

[14] Thomas Funkhouser, Nicolas Tsingos, and Jean-Marc Jot. Survey of methods for modeling sound propagation in interactive virtual environment systems. *Presence and Teleoperation*, 2003.

[15] C Guiffaut and K Mandjoubi. A parallel fdtd algorithm using the mpi library. *Antennas and Propagation Magazine, IEEE*, 43(2):94-103, 2001.

[16] J Mark Keil. Polygon decomposition. *Handbook of Computational Geometry*, 2:491-518, 2000.

[17] Konrad Kowalczyk and Maarten van Walstijn. Room acoustics simulation using 3-d compact explicit fdtd schemes. *Audio, Speech, and Language Processing, IEEE Transactions on*, 19(1):34-46, 2011.

[18] Ravish Mehra, Lakulish Antani, Sujeong Kim, and Dinesh Manocha. Source and listener directivity for interactive wave-based sound propagation. *Visualization and Computer Graphics, IEEE Transactions on*, 20(4):495-503, 2014.

[19] Ravish Mehra, Nikunj Raghuvanshi, Lauri Savioja, Ming C Lin, and Dinesh Manocha. An efficient gpu-based time domain solver for the acoustic wave equation. *Applied Acoustics*, 73(2):83-94, 2012.

[20] Nicolas Morales, Vivek Chavda, Ravish Mehra, and Dinesh Manocha. Mpard: A scalable time-domain acoustic wave solver for large distributed clusters. Technical report, Department of Computer Science, University of North Carolina at Chapel Hill, Chapel Hill, N. C., 2015.

[21] Stéphane Operto, Jean Virieux, Patrick Amestoy, Jean-Yves LÅ'Excellent, Luc Giraud, and Hafedh Ben Hadj Ali. 3d finite-difference frequency-domain modeling of visco-acoustic wave propagation using a massively parallel direct solver: A feasibility study. *Geophysics*, 72(5): SM195-SM211, 2007.

[22] Nikunj Raghuvanshi, Rahul Narain, and Ming C Lin. Efficient and accurate sound propagation using adaptive rectangular decomposition. *Visualization and Computer Graphics, IEEE Transactions on*, 15(5):789-801, 2009.

[23] Jukka Saarelma and Lauri Savioja. An open source finite-difference time-domain solver for room acoustics using graphics processing units. *Acta Acustica united with Acustica*, 2014.

[24] Faisal Saied and Michael J Hoist. Multigrid methods for computational acoustics on vector and parallel computers. *Urbana*, 51:61801, 1991.

[25] Shinichi Sakamoto, Ayumi Ushiyama, and Hiroshi Nagatomo. Numerical analysis of sound propagation in rooms using the finite difference time domain method. *The Journal of the Acoustical Society of America*, 120(5): 3008-3008, 2006.

[26] Lauri Savioja and V Valimaki. Reducing the dispersion error in the digital waveguide mesh using interpolation and frequency-warping techniques. *Speech and Audio Processing, IEEE Transactions on*, 8(2):184-194, 2000.

[27] Lauri Savioja. Real-time 3d finite-difference time-domain simulation of low- and mid-frequency room acoustics. In *13th Int. Conf on Digital Audio Effects*, volume 1, page 75, 2010.

[28] Carl Schissler, Ravish Mehra, and Dinesh Manocha. High-order diffraction and diffuse reflections for interactive sound propagation in large environments. *ACM Transactions on Graphics (SIGGRAPH 2014)*, 33(4):39, 2014.

[29] Jonathan Sheaffer and BM Fazenda. Wavecloud: an open source room acoustics simulator using the finite difference time domain method. *Acta Acustica united with Acustica*, 2014.

[30] Piotr Sypek, Adam Dziekonski, and Michal Mrozowski. How to render fdtd computations more effective using a graphics accelerator. *Magnetics, IEEE Transactions on*, 45(3):1324-1327, 2009.

[31] Lonny L Thompson. A review of finite-element methods for time-harmonic acoustics. *J. Acoust. Soc. Am*, 119(3):1315-1330, 2006.

[32] Alessandro Vaccari, Antonino Cala'Lesina, L Cristoforetti, and R Pontalti. Parallel implementation of a 3d subgridding fdtd algorithm for large simulations. *Progress In Electromagnetics Research*, 120:263-292, 2011.

[33] Shen Wang, Maarten V de Hoop, Jianlin Xia, and Xiaoye S Li. Massively parallel structured multifrontal solver for time-harmonic elastic waves in 3-d anisotropic media. *Geophysical Journal International*, 191(1):346-366, 2012.

[34] Craig J Webb and Stefan Bilbao. Binaural simulations using audio rate fdtd schemes and cuda. In *Proc. of the 15th Int. Conference on Digital Audio Effects (DAFx-12)*, York, United Kingdom, 2012.

[35] Hengchin Yeh, Ravish Mehra, Zhimin Ren, Lakulish Antani, Dinesh Manocha, and Ming Lin. Wave-ray coupling for interactive sound propagation in large complex scenes. *ACM Transactions on Graphics (TOG)*, 32(6):165, 2013.

[36] Wenhua Yu, Yongjun Liu, Tao Su, Neng-Tien Hunag, and Raj Mittra. A robust parallel conformal finite-difference time-domain processing package using the mpi library. *Antennas and Propagation Magazine, IEEE*, 47(3):39-59, 2005.

[37] Wenhua Yu, Xiaoling Yang, Yongjun Liu, Lai-Ching Ma, Tao Sul, Neng-Tien Huang, Raj Mittra, Rob Maaskant, Yongquan Lu, Qing Che, et al. A new direction in computational electromagnetics: Solving large problems using the parallel fdtd on the bluegene/I supercomputer providing teraflop-level performance. *Antennas and Propagation Magazine, IEEE*, 50(2):26-44, 2008.

[38] Ü. Çatalyürek and C. Aykanat. Patoh (partitioning tool for hypergraphs). In *Encyclopedia of Parallel Computing*, pages 1479-1487. Springer, 2011.

[39] T. Funkhouser, I. Carlbom, G. Elko, G. Pingali, M. Sondhi, and J. West. A beam tracing approach to acoustic modeling for interactive virtual environments. In *Proc. of ACM SIGGRAPH*, pages 21-32, 1998.

[40] J. Huang, R. Yagel, V. Filippov, and Y. Kurzion. An accurate method for voxelizing polygon meshes. In *Volume Visualization, 1998. IEEE Symposium on*, pages 119-126. IEEE, 1998.

[41] H. Kuttruff. *Room acoustics*. CRC Press, 2009.

[42] Y. S. Rickard, N. K. Georgieva, and W.-P. Huang. Application and optimization of pml abc for the 3-d wave equation in the time domain. *Antennas and Propagation, IEEE Transactions on*, 51(2):286-295, 2003.

[43] L. Savioja, J. Backman, A. Jarvinen, and T. Takala. Waveguide mesh method for low-frequency simulation of room acoustics. 1995.

[44] P. Schwan. Lustre: Building a file system for 1000-node clusters. In *Proceedings of the 2003 Linux Symposium*, volume 2003, 2003

[45] S. Van Duyne and J. O. Smith. The 2-d digital waveguide mesh. In *Applications of Signal Processing to Audio and Acoustics, 1993. Final Program and Paper Summaries., 1993 IEEE Workshop on*, pages 177-180. IEEE, 1993.

What is claimed is:

1. A method for utilizing parallel adaptive rectangular decomposition (ARD) to perform acoustic simulations, the method comprising:
    assigning, to each of a plurality of processors in a central processing unit (CPU) cluster, ARD processing responsibilities associated with one or more of a plurality of partitions of an acoustic space;
    determining, by each processor, pressure field data corresponding to the one or more assigned partitions;
    transferring, by each processor, the pressure field data to at least one remote processor that is assigned to a partition that shares an interface with at least one partition assigned to the transferring processor;
    receiving, by each processor from the at least one remote processor, forcing term values that have been derived by the at least one remote processor using the pressure field data; and
    utilizing, by each processor, the received forcing term values to calculate at least one local partition pressure field that is used to update a global pressure field associated with the acoustic space.

2. The method of claim 1 comprising decomposing the acoustic space into the plurality of partitions.

3. The method of claim 1 comprising computing, by each remote processor, the forcing term values using the pressure field data received from other processors.

4. The method of claim 1 wherein each of the plurality of partitions includes an air partition or a perfectly matched layer (PML) partition.

5. The method of claim 1 comprising voxelizing the acoustic space into grid cells, wherein the grid cells are subsequently grouped into the plurality of partitions via ARD.

6. The method of claim 1 wherein each of the plurality of processors stores metadata corresponding to partitions that are assigned to other processors.

7. The method of claim 1 wherein each of the assigning, determining, transferring, receiving, and utilizing elements is respectively performed by each of the processors in a discrete time step.

8. The method of claim 7 comprising utilizing a synchronization barrier that prevents a processor from proceeding to a subsequent discrete time step until all of the processors have completed the current discrete time step.

9. The method of claim 1 comprising dividing an orthogonal plane that separates an original partition from among the plurality of partitions into two partitions, wherein a first partition of the two partitions is equal to Q, where Q is a volume that does not exceed a value equal to a total volume of the acoustic space divided by a number representing the plurality of processors, and the second partition of the two partitions is equal to a difference between a volume of the original partition and Q.

10. The method of claim 9 further comprising reassigning, to each of the plurality of processors, ARD processing responsibilities associated with one or more of a plurality of partitions that includes the two partitions.

11. The method of claim 1 wherein the plurality of processors are assigned ARD processing responsibilities in accordance to a hypergraph partitioning process.

12. The method of claim 11 wherein the hypergraph partitioning process comprises:
    voxelizing the acoustic space;
    dividing the acoustic space into the plurality of partitions, wherein the plurality of partitions are non-overlapping;
    calculating interface regions shared by the partitions; and
    generating a hypergraph that comprises node weights and hyperedge weights, wherein the node weights are based on sizes of the partitions and the hyperedge weights are based on sizes of the interface regions shared by the plurality of partitions.

13. The method of claim 12 further comprising splitting one of the plurality of partitions into two or more subdomain partitions in the event that the partition exceeds a volume threshold.

14. The method of claim 13 wherein each of the two or more subdomain partitions are included in the hypergraph.

15. The method of claim 12 wherein each of the processors is provided with data corresponding to the interface regions and PML regions that are associated with the partition assigned to that processor.

16. A system for utilizing parallel adaptive rectangular decomposition (ARD) to perform acoustic simulations, the system comprising:

a processor;
a preprocessing module executable by the processor, wherein the preprocessing module is configured to assign, to each of a plurality of processors in a central processing unit (CPU) cluster, ARD processing responsibilities associated with one or more of a plurality of partitions of an acoustic space; and
a parallel ARD simulation module executable by the processor, wherein the parallel ARD simulation module is configured to:
determine, by each processor, pressure field data corresponding to the one or more assigned partitions;
transfer, by each processor, the pressure field data to at least one remote processor that is assigned to a partition that shares an interface with at least one partition assigned to the transferring processor;
receive, by each processor from the at least one remote processor, forcing term values that have been derived by the at least one remote processor using the pressure field data; and
utilize, by each processor, the received forcing term values to calculate at least one local partition pressure field that is used to update a global pressure field associated with the acoustic space.

17. The system of claim 16 wherein the preprocessing module is further configured to decompose the acoustic space into the plurality of partitions.

18. The system of claim 16 wherein the parallel ARD simulation module is further configured to compute, by each remote processor, the forcing term values using the pressure field data received from other processors.

19. The system of claim 16 wherein each of the plurality of partitions includes an air partition or a perfectly matched layer (PML) partition.

20. The system of claim 16 wherein the preprocessing module is further configured to voxelize the acoustic space into grid cells, wherein the grid cells are subsequently grouped into the plurality of partitions via ARD.

21. The system of claim 16 wherein each of the plurality of processors stores metadata corresponding to partitions that are assigned to other processors.

22. The system of claim 16 wherein each of the assigning, determining, transferring, receiving, and utilizing elements is respectively performed by each of the processors in a discrete time step.

23. The system of claim 22 wherein the parallel ARD simulation module is further configured to utilize a synchronization barrier that prevents a processor from proceeding to a subsequent discrete time step until all of the processors have completed the current discrete time step.

24. The system of claim 16 wherein the system further includes a load balancing module configured to divide an orthogonal plane that separates an original partition from among the plurality of partitions into two partitions, wherein a first partition of the two partitions is equal to Q, where Q is a volume that does not exceed a value equal to a total volume of the acoustic space divided by a number representing the plurality of processors, and the second partition of the two partitions is equal to a difference between a volume of the original partition and Q.

25. The system of claim 24 wherein the preprocessing module is further configured to reassign, to each of the plurality of processors, ARD processing responsibilities associated with one or more of a plurality of partitions that includes the two partitions.

26. The system of claim 16 wherein the plurality of processors are assigned ARD processing responsibilities in accordance to a hypergraph partitioning process.

27. The system of claim 26 wherein the preprocessing module is further configured to:
voxelize the acoustic space;
divide the acoustic space into the plurality of partitions, wherein the plurality of partitions are non-overlapping;
calculate interface regions shared by the partitions; and
generate a hypergraph that comprises node weights and hyperedge weights, wherein the node weights are based on sizes of the partitions and the hyperedge weights are based on sizes of the interface regions shared by the plurality of partitions.

28. The system of claim 27 wherein the preprocessing module is further configured to split one of the plurality of partitions into two or more subdomain partitions in the event that the partition exceeds a volume threshold.

29. The system of claim 28 wherein each of the two or more subdomain partitions are included in the hypergraph.

30. The system of claim 27 wherein each of the processors is provided with data corresponding to the interface regions and PML regions that are associated with the partition assigned to that processor.

31. A non-transitory computer readable medium having stored thereon executable instructions that when executed by a processor of a computer control the computer to perform steps comprising:
assigning, to each of a plurality of processors in a central processing unit (CPU) cluster, ARD processing responsibilities associated with one or more of a plurality of partitions of an acoustic space;
determining, by each processor, pressure field data corresponding to the one or more assigned partitions;
transferring, by each processor, the pressure field data to at least one remote processor that is assigned to a partition that shares an interface with at least one partition assigned to the transferring processor;
receiving, by each processor from the at least one remote processor, forcing term values that have been derived by the at least one remote processor using the pressure field data; and
utilizing, by each processor, the received forcing term values to calculate at least one local partition pressure field that is used to update a global pressure field associated with the acoustic space.

32. The non-transitory computer readable medium of claim 31 comprising decomposing the acoustic space into the plurality of partitions.

33. The non-transitory computer readable medium of claim 31 comprising computing, by each remote processor, the forcing term values using the pressure field data received from other processors.

34. The non-transitory computer readable medium of claim 31 wherein each of the plurality of partitions includes an air partition or a perfectly matched layer (PML) partition.

35. The non-transitory computer readable medium of claim 31 comprising voxelizing the acoustic space into grid cells, wherein the grid cells are subsequently grouped into the plurality of partitions via ARD.

36. The non-transitory computer readable medium of claim 31 wherein each of the plurality of processors stores metadata corresponding to partitions that are assigned to other processors.

37. The non-transitory computer readable medium of claim 31 wherein each of the assigning, determining, transferring, receiving, and utilizing elements is respectively performed by each of the processors in a discrete time step.

38. The non-transitory computer readable medium of claim 37 comprising utilizing a synchronization barrier that prevents a processor from proceeding to a subsequent discrete time step until all of the processors have completed the current discrete time step.

39. The non-transitory computer readable medium of claim 31 comprising dividing an orthogonal plane that separates an original partition from among the plurality of partitions into two partitions, wherein a first partition of the two partitions is equal to Q, where Q is a volume that does not exceed a value equal to a total volume of the acoustic space divided by a number representing the plurality of processors, and the second partition of the two partitions is equal to a difference between a volume of the original partition and Q.

40. The non-transitory computer readable medium of claim 39 further comprising reassigning, to each of the plurality of processors, ARD processing responsibilities associated with one or more of a plurality of partitions that includes the two partitions.

41. The non-transitory computer readable medium of claim 31 wherein the plurality of processors are assigned ARD processing responsibilities in accordance to a hypergraph partitioning process.

42. The non-transitory computer readable medium of claim 41 wherein the hypergraph partitioning process comprises:
    voxelizing the acoustic space;
    dividing the acoustic space into the plurality of partitions, wherein the plurality of partitions are non-overlapping;
    calculating interface regions shared by the partitions; and
    generating a hypergraph that comprises node weights and hyperedge weights, wherein the node weights are based on sizes of the partitions and the hyperedge weights are based on sizes of the interface regions shared by the plurality of partitions.

43. The non-transitory computer readable medium of claim 42 further comprising splitting one of the plurality of partitions into two or more subdomain partitions in the event that the partition exceeds a volume threshold.

44. The non-transitory computer readable medium of claim 43 wherein each of the two or more subdomain partitions are included in the hypergraph.

45. The non-transitory computer readable medium of claim 42 wherein each of the processors is provided with data corresponding to the interface regions and PML regions that are associated with the partition assigned to that processor.

* * * * *